US010732474B2

(12) United States Patent
Lee et al.

(10) Patent No.: US 10,732,474 B2
(45) Date of Patent: Aug. 4, 2020

(54) DISPLAY APPARATUS

(71) Applicant: Samsung Display Co., Ltd., Yongin-si (KR)

(72) Inventors: Sehyun Lee, Hwaseong-si (KR); Haksun Chang, Yongin-si (KR); Byoungsun Na, Seoul (KR); Seungmin Lee, Seoul (KR); Jaeho Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/266,678

(22) Filed: Feb. 4, 2019

(65) Prior Publication Data

US 2019/0243198 A1  Aug. 8, 2019

(30) Foreign Application Priority Data

Feb. 5, 2018  (KR) .................. 10-2018-0014234

(51) Int. Cl.
| | |
|---|---|
| *H01L 27/14* | (2006.01) |
| *G02F 1/1362* | (2006.01) |
| *G02F 1/1368* | (2006.01) |
| *G02F 1/1343* | (2006.01) |
| *H01L 27/12* | (2006.01) |

(52) U.S. Cl.
CPC ...... *G02F 1/136286* (2013.01); *G02F 1/1368* (2013.01); *G02F 1/134309* (2013.01); *H01L 27/124* (2013.01); *G02F 2001/134318* (2013.01); *G02F 2201/121* (2013.01); *G02F 2201/123* (2013.01); *H01L 27/1255* (2013.01)

(58) Field of Classification Search
CPC ... H01L 27/12; H01L 27/124; H01L 27/1255; G02F 1/136286; G02F 1/134309
See application file for complete search history.

(56) References Cited

U.S. PATENT DOCUMENTS

| | | | |
|---|---|---|---|
| 7,138,656 B2 * | 11/2006 | Yu | ............. G02F 1/13624 257/59 |
| 8,144,294 B2 | 3/2012 | Um et al. | |
| 8,174,655 B2 | 5/2012 | Park et al. | |
| 9,551,905 B2 | 1/2017 | Song et al. | |
| 9,823,512 B2 | 11/2017 | Chang et al. | |

(Continued)

FOREIGN PATENT DOCUMENTS

| | | |
|---|---|---|
| KR | 10-1327855 | 11/2013 |
| KR | 10-2015-0048469 | 5/2015 |

(Continued)

*Primary Examiner* — Phuc T Dang
(74) *Attorney, Agent, or Firm* — H.C. Park & Associates, PLC

(57) ABSTRACT

A display apparatus includes a pixel connected to a data line. The pixel includes a first pixel electrode and a second pixel electrode spaced apart from the first pixel electrode in an extension direction of the data line. The second pixel electrode includes first to fourth stem portions. The third and fourth stem portions are further from the first pixel electrode than the first and second stem portions in the extension direction. The first and second stem portions are connected to one another to form a "V"-shaped structure. The third and fourth stem portions are connected to one another to form an inverted "V"-shaped structure.

17 Claims, 9 Drawing Sheets

(56) References Cited

U.S. PATENT DOCUMENTS

| 2016/0097953 | A1 | 4/2016 | Chang et al. | |
| 2018/0174519 | A1* | 6/2018 | Kim | G09G 3/3233 |
| 2018/0267370 | A1* | 9/2018 | Chu | G02F 1/134309 |
| 2019/0129255 | A1 | 5/2019 | Lee et al. | |

FOREIGN PATENT DOCUMENTS

| KR | 10-1566437 | 11/2015 |
| KR | 10-2016-0027333 | 3/2016 |
| KR | 10-2019-0049964 | 5/2019 |

* cited by examiner

DISPLAY APPARATUS

CROSS-REFERENCE TO RELATED APPLICATION

This application claims priority from and the benefit of Korean Patent Application No. 10-2018-0014234, filed Feb. 5, 2018, which is hereby incorporated by reference for all purposes as if fully set forth herein.

BACKGROUND

Field

Exemplary embodiments generally relate to a display apparatus, and in particular, to a display apparatus with high display quality.

Discussion

A display apparatus typically includes a first substrate, on which a plurality of pixel electrodes corresponding to a plurality of pixels are provided, a second substrate, which is provided to face the first substrate and is provided with a common electrode, and a liquid crystal layer, which is interposed between the first and second substrates. An electric field, which is produced by a difference between a data voltage applied to the pixel electrodes and a common voltage applied to the common electrode, is used to change alignment of liquid crystal molecules in the liquid crystal layer. The change of the alignment of the liquid crystal molecules is used to control optical transmittance of each pixel and to display an image.

In the case that the display apparatus has the above structure, it may suffer from reduced viewing angle characteristics. The smaller the difference between lateral visibility and frontal visibility, the better the viewing angle characteristics of the display apparatus. To improve the viewing angle characteristics, some display devices include pixels divided into a plurality of subpixels, and, thereby, separately drive a brightness property, and include a plurality of slits formed in at least a portion of the pixel and common electrodes. In the case where the pixel is divided into a plurality of subpixels having different brightness properties, shapes of the pixel and common electrodes may result in a difference between frontal and lateral brightness characteristics in a certain region, and this may lead to a recognizable stain.

The above information disclosed in this section is only for understanding the background of the inventive concepts, and, therefore, may contain information that does not form prior art.

SUMMARY

Some exemplary embodiments are capable of providing a display apparatus configured to prevent deterioration in display quality by a viewing angle.

Additional aspects will be set forth in the detailed description which follows, and, in part, will be apparent from the disclosure, or may be learned by practice of the inventive concepts.

According to some exemplary embodiments, a display apparatus includes a gate line extending in a first direction, data lines extending in a second direction crossing the first direction, and a pixel connected to the gate line and a corresponding data line of the data lines. The pixel includes a first pixel electrode, a second pixel electrode spaced apart from the first pixel electrode in the second direction, and a common electrode facing the first and second pixel electrodes. A left region and a right region are defined in the pixel between two adjacent data lines of the data lines based on an imaginary line passing through a center between the two adjacent data lines. The imaginary line extends parallel to the second direction. The second pixel electrode includes a first stem portion, a second stem portion, a third stem portion, a fourth stem portion, first branch portions, second branch portions, third branch portions, and fourth branch portions. The first stem portion is in the right region and extends in a third direction oriented from an origin of a plane, the plane being defined by the first and second directions. The first stem portion extends toward a point in a first quadrant of the plane. The second stem portion is in the left region and is adjacent to the first stem portion in the first direction, the second stem portion extending in a fourth direction oriented from the origin of the plane toward a point in a second quadrant of the plane. The third stem portion is in the right region and extends in the fourth direction. The third stem portion is farther from the first pixel electrode than the first stem portion in the second direction. The fourth stem portion is in the left region and extends in the third direction. The fourth stem portion is farther from the first pixel electrode than the second stem portion in the second direction. The first branch portions protrude from the first stem portion in the fourth direction and are spaced apart from each other. The second branch portions protrude from the second stem portion in the third direction and are spaced apart from each other. The third branch portions protrude from the third stem portion in the third direction and are spaced apart from each other. The fourth branch portions protrude from the fourth stem portion in the fourth direction and are spaced apart from each other.

In some exemplary embodiments, ends of the first to fourth stem portions may be connected to each other.

In some exemplary embodiments, the first branch portions may include a first sub-branch portion protruding in the fourth direction from a first side of the first stem portion, and a second sub-branch portion protruding in the fourth direction from a second side of the first stem portion, the second side of the first stem portion being opposite the first side of the first stem portion. The second branch portions may include a third sub-branch portion protruding in the third direction from a first side of the second stem portion, and a fourth sub-branch portion protruding in the third direction from a second side of the second stem portion, the second side of the second stem portion being opposite the first side of the second stem portion. The third branch portions may include a fifth sub-branch portion protruding in the third direction from a first side of the third stem portion, and a sixth sub-branch portion protruding in the third direction from a second side of the third stem portion, the second side of the third stem portion being opposite the first side of the third stem portion. The fourth branch portions may include a seventh sub-branch portion protruding in the fourth direction from a first side of the fourth stem portion, and an eighth sub-branch portion protruding in the fourth direction from a second side of the fourth stem portion, the second side of the fourth stem portion being opposite the first side of the fourth stem portion.

In some exemplary embodiments, each of the first to eighth sub-branch portions may include lengthening branches, constant branches, and shortening branches arranged in an determined order. The lengthening branches may have lengths increasing in an extension direction of a corresponding stem portion of the first to fourth stem portions from an end of the corresponding stem portion to an opposite end. The constant branches may have a constant length. The shortening branches may have lengths decreasing in the extension direction from the end of the corresponding stem portion to the opposite end.

In some exemplary embodiments, the first pixel electrode may include a fifth stem portion in the right region and extending in the third direction; a sixth stem portion in the left region and extending in the fourth direction, the sixth stem portion being adjacent to the fifth stem portion in the first direction; fifth branch portions protruding from the fifth stem portion in the fourth direction and being spaced apart from each other; and sixth branch portions protruding from the sixth stem portion in the third direction and being spaced apart from each other.

In some exemplary embodiments, ends of the fifth and sixth stem portions may be connected to each other.

In some exemplary embodiments, the fifth branch portions may include a ninth sub-branch portion protruding in the fourth direction from a first side of the fifth stem portion, and a tenth sub-branch portion protruding in the fourth direction from a second side of the fifth stem portion, the second side of the fifth stem portion being opposite the first side of the fifth stem portion. The sixth branch portions may include an eleventh sub-branch portion protruding in the third direction from a first side of the sixth stem portion, and a twelfth sub-branch portion protruding in the third direction from a second side of the sixth stem portion, the second side of the sixth stem portion being opposite the first side of the sixth stem portion.

In some exemplary embodiments, each of the ninth to twelfth sub-branch portions may include lengthening branches, constant branches, and shortening branches arranged in a determined order. The lengthening branches may have lengths increasing in an extension direction of a corresponding stem portion of the fifth and sixth stem portions from an end of the corresponding stem portion to an opposite end. The constant branches may have a constant length. The shortening branches may have lengths decreasing in the extension direction from the end of the corresponding stem portion to the opposite end.

In some exemplary embodiments, the common electrode may include a first common electrode and a second common electrode. The first common electrode may include a first extended portion overlapping with the first stem portion and extending in the third direction, and a second extended portion connected to an end of the first extended portion, the second extended portion overlapping with the second stem portion and extending in the fourth direction. The second common electrode may include a third extended portion overlapping with the third stem portion and extending in the fourth direction, and a fourth extended portion connected to an end of the third extended portion, the fourth extended portion overlapping with the fourth stem portion and extending in the third direction.

In some exemplary embodiments, the first common electrode may further include a first wing portion, a second wing portion, and a first vertically extended portion. The first wing portion may overlap with the first stem portion and may extend from an opposite end of the first extended portion that is spaced apart, in the second direction, from the end of the first extended portion. The second wing portion may overlap with the second stem portion and may extend from an opposite end of the second extended portion that is spaced apart, in the second direction, from an end of the second extended portion connected to the end of the first extended portion. The first vertically extended portion may extend in the second direction from the ends of the first and second extended portions that are connected to one another. The second common electrode may further include a third wing portion, a fourth wing portion, and a second vertically extended portion. The third wing portion may overlapping with the third stem portion and may extend from an opposite end of the third extended portion that is spaced apart, in the second direction, from the end of the third extended portion. The fourth wing portion may overlap with the fourth stem portion and may extend from an opposite end of the fourth extended portion that is spaced apart, in the second direction, from an end of the fourth extended portion connected to the end of the third extended portion. The second vertically extended portion may extend in the second direction from the ends of the third and fourth extended portions that are connected to one another.

In some exemplary embodiments, each of the first to fourth wing portions may be connected to a corresponding one of the first to fourth extended portions at an obtuse angle. The first vertically extended portion may be connected to each of the first and second stem portions at an obtuse angle. The second vertically extended portion may be connected to each of the third and fourth stem portions at an obtuse angle.

In some exemplary embodiments, the first pixel electrode may include a fifth stem portion, a sixth stem portion, fifth branch portions, and sixth branch portions. The fifth stem portion may be in the right region and may extend in the third direction. The sixth stem portion may be in the left region and may extend in the fourth direction. The sixth stem portion may be adjacent to the fifth stem portion in the first direction. The fifth branch portions may protrude from the fifth stem portion in the fourth direction and may be spaced apart from each other. The sixth branch portions may protrude from the sixth stem portion in the third direction and may be spaced apart from each other. The common electrode may further include a third common electrode. The third common electrode may include a fifth extended portion overlapping with the fifth stem portion and extending in the third direction, and a sixth extended portion connected to an end of the fifth extended portion. The sixth extended portion may overlap with the sixth stem portion and may extend in the fourth direction.

In some exemplary embodiments, the third common electrode may further include a fifth wing portion, a sixth wing portion, and a third vertically extended portion. The fifth wing portion may overlap with the fifth stem portion and may extend from an opposite end of the fifth extended portion that is spaced apart, in the second direction, from the end of the fifth extended portion. The sixth wing portion may overlap with the sixth stem portion and may extend from an opposite end of the sixth extended portion that is spaced apart, in the second direction, from an end of the sixth extended portion connected to the end of the fifth extended portion. The third vertically extended portion may extend in the second direction from the ends of the fifth and sixth extended portions that are connected to one another.

In some exemplary embodiments, each of the fifth and sixth wing portions may be connected to a corresponding one of the fifth and sixth extended portions at an obtuse angle, and the third vertically extended portion may be connected to each of the fifth and sixth stem portions at an obtuse angle.

In some exemplary embodiments, the pixel may further include a first transistor connected to the gate line, the corresponding data line, and the first pixel electrode; a second transistor connected to the gate line, the corresponding data line, and the second pixel electrode; and a third transistor connected to the gate line, the second pixel electrode, and a storage line disposed in a same layer as the corresponding data line.

In some exemplary embodiments, the first to third transistors may be disposed in a first border region. The first boarded region may be disposed between the first and second pixel electrodes in the second direction.

In some exemplary embodiments, the pixel may further include a shielding electrode covering the data lines and disposed in a same layer as the first and second pixel electrodes.

According to some exemplary embodiments, a display apparatus includes a gate line extending in a first direction, data lines extending in a second direction crossing the first direction, and a pixel connected to the gate line and a corresponding data line of the data lines. The pixel includes a first pixel electrode, a second pixel electrode spaced apart from the first pixel electrode in the second direction, and a common electrode facing the first and second pixel electrodes. A left region and a right region are defined in the pixel between two adjacent data lines of the data lines based on an imaginary line passing through a center between the two adjacent data lines. The imaginary line is parallel to the second direction. The second pixel electrode includes a first stem portion, a second stem portion, a third stem portion, and a fourth stem portion. The first stem portion is in the right region and extends in a third direction oriented from an origin of a plane. The plane is defined by the first and second directions. The first stem portion extends toward a point in a first quadrant of the plane. The second stem portion is in the left region and is adjacent to the first stem portion in the first direction. The second stem portion extends in a fourth direction oriented from the origin of the plane toward a point in a second quadrant of the plane. The third stem portion is in the right region and is adjacent to the first stem portion in the second direction. The third stem portion extends in the fourth direction. The fourth stem portion is in the left region and is adjacent to the second stem portion in the second direction. The fourth stem portion extends in the third direction. The first stem portion and the second stem portion are connected to each other to form a "V"-shaped structure. The third stem portion and the fourth stem portion are connected to each other to form an inverted "V"-shaped structure.

In some exemplary embodiments, first pixel electrode may include a fifth stem portion in the right region and extending in the third direction, and a sixth stem portion in the left region and adjacent to the fifth stem portion in the first direction, the sixth stem portion extending in the fourth direction. The fifth stem portion and the sixth stem portion may be connected to each other to form a "V"-shaped structure.

In some exemplary embodiments, the common electrode may include a first common electrode, a second common electrode, and a third common electrode. The first common electrode may include a first extended portion overlapping with the first stem portion and extending in the third direction, and a second extended portion connected to an end of the first extended portion. The second extended portion may overlap with the second stem portion and may extend in the fourth direction. The first common electrode may have a "V"-shaped structure. The second common electrode may include a third extended portion overlapping with the third stem portion and extending in the fourth direction, and a fourth extended portion connected to an end of the third extended portion. The fourth extended portion may overlap with the fourth stem portion and may extend in the third direction. The second common electrode may have an inverted "V"-shaped structure. The third common electrode may include a fifth extended portion overlapping with the fifth stem portion and extending in the third direction, and a sixth extended portion connected to an end of the fifth extended portion. The sixth extended portion may overlap with the sixth stem portion and may extend in the fourth direction. The third common electrode may have a "V"-shaped structure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
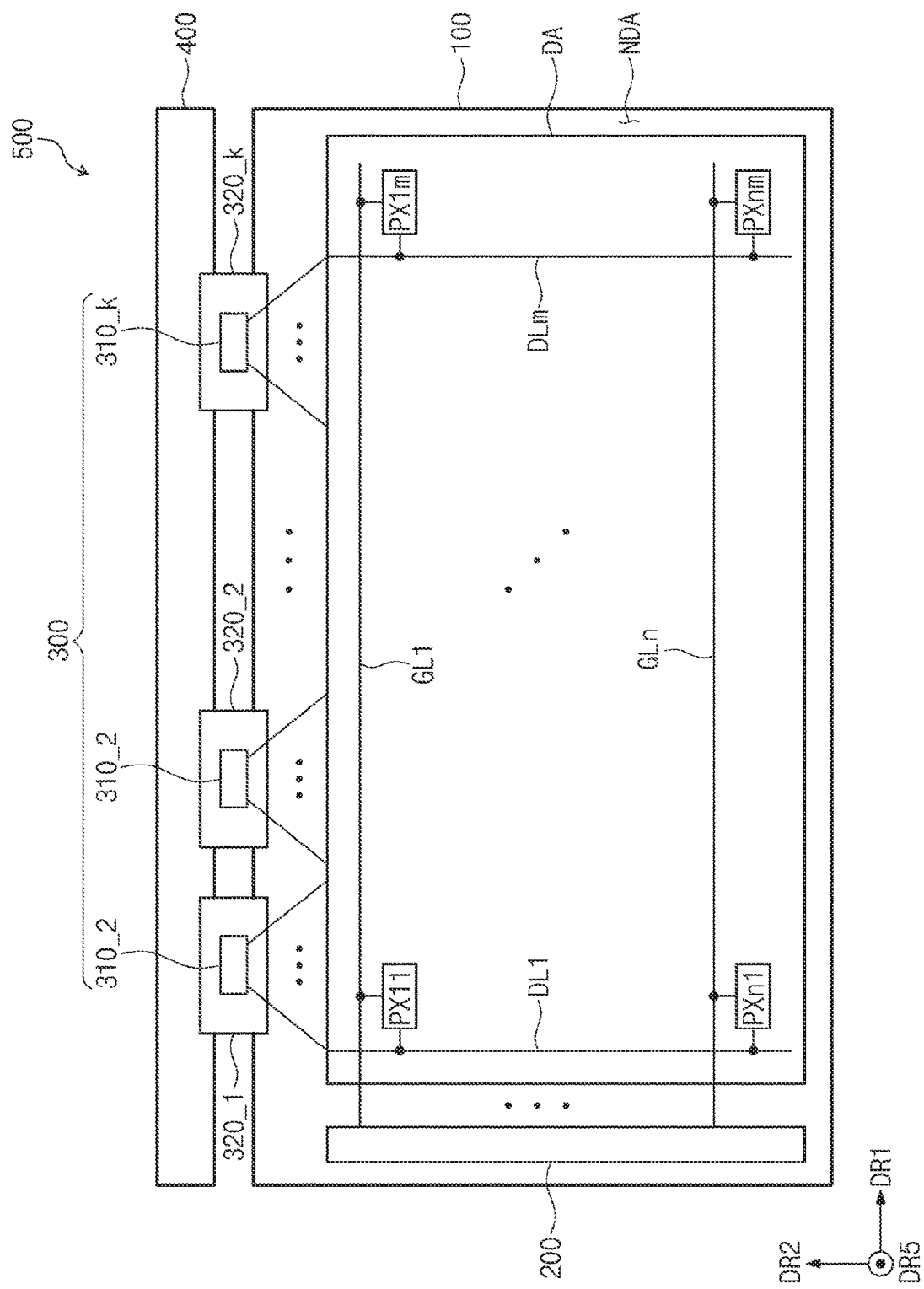
FIG. 1 is a plan view illustrating a display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments.

Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, chips, drivers, units, and/or modules. Those skilled in the art will appreciate that these blocks, chips, drivers, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, chips, drivers, units, and/or modules being implemented by microprocessors or other similar hardware, they may be programmed and controlled using software (e.g., microcode) to perform various functions discussed herein and may optionally be driven by firmware and/or software. It is also contemplated that each block, chip, driver, unit, and/or module may be implemented by dedicated hardware, or as a combination of dedicated hardware to perform some functions and a processor (e.g., one or more programmed microprocessors and associated circuitry) to perform other functions. Also, each block, chip, driver, unit, and/or module of some exemplary embodiments may be physically separated into two or more interacting and discrete blocks, chips, drivers, units, and/or modules without departing from the inventive concepts. Further, the blocks, chips, drivers, units, and/or modules of some exemplary embodiments may be physically combined into more complex blocks, chips, drivers, units, and/or modules without departing from the inventive concepts.

FIG. 1 is a plan view illustrating a display apparatus according to some exemplary embodiments.

Referring to FIG. 1, a display apparatus 500 may include a display panel 100, a gate driver 200, a data driver 300, and a driving circuit board 400. Although specific reference will be made to this particular implementation, it is also contemplated that the display apparatus 500 may embody many forms and include multiple and/or alternative components.

The display panel 100 may include a plurality of pixels PX11-PXnm, a plurality of gate lines GL1-GLn, and a plurality of data lines DL1-DLm. When viewed in a plan view (e.g., when viewed in a fifth direction DR5), the display panel 100 may include a display region DA and a non-display region NDA, which is provided outside the display region DA, such as around the display region DA.

The pixels PX11-PXnm may be provided in the display region DA and may be arranged in a matrix shape (or arrangement). For example, the pixels PX11-PXnm may be arranged to form n rows and m columns crossing each other, where m and n are natural numbers.

The gate lines GL1-GLn and the data lines DL1-DLm may be electrically disconnected from each other and may be provided to cross each other. The gate lines GL1-GLn may be connected to the gate driver 200 to receive gate signals, which may be provided (e.g., sequentially provided) from the gate driver 200. The data lines DL1-DLm may be connected to the data driver 300 to receive data voltages, which are provided in the form of analog signals.

Each of the pixels PX11-PXnm may be connected to a corresponding one of the gate lines GL1-GLn and a corresponding one of the data lines DL1-DLm; however, exemplary embodiments are not limited thereto. The pixels PX11-PXnm may receive data voltages through the data lines DL1-DLm connected thereto, in response to gate signals transmitted through the corresponding one of the gate lines GL1-GLn. The pixels PX11-PXnm may be configured to display images with gradation levels corresponding to the data voltages.

The gate driver 200 may be configured to generate gate signals, in response to a gate control signal provided from a timing controller (not shown), which may be mounted on the driving circuit board 400. The gate signals may be provided, in a sequential and row-by-row manner, to the pixels PX11-PXnm through the gate lines GL1-GLn. As a result, the pixels PX11-PXnm may be driven row-by-row.

The gate driver 200 may be provided at a left region of the non-display region NDA, which is located adjacent to a left side of the display region DA. The gate driver 200 may be provided in the form of an amorphous silicon thin film transistor (TFT) gate (ASG) driver circuit and may be mounted on the left region of the non-display region NDA, which is located adjacent to the left side of the display region DA. However, exemplary embodiments are not limited thereto. For instance, the gate driver 200 may include a plurality of gate driving chips. The gate driving chips may be mounted on the non-display region NDA, which is located adjacent to the left side of the display region DA, in a chip-on-glass (COG) or tape-carrier-package (TCP) manner. It is also contemplated that gate driving chips may be mounted on the non-display region NDA adjacent to the left and right sides of the display region DA, or in any other suitable arrangement.

The data driver 300 may receive image signals and data control signals from the timing controller. The data driver 300 may be configured to generate data voltages, which are analog signals corresponding to the image signals, in response to the data control signal. The data driver 300 may provide the data voltages to the pixels PX11-PXnm through the data lines DL1-DLm.

The data driver 300 may include a plurality of source driving chips 310_1-310_k, where k is a natural number smaller than m. Each of the source driving chips 310_1-310_k may be mounted on a corresponding one of the flexible circuit boards 320 1-320_k and may be connected to the driving circuit board 400 and an upper region of the non-display region NDA, which is located at an upper side of the display region DA. In other words, the data driver 300 may be connected to the display panel 100 in a tape-carrier-package (TCP) manner. However, exemplary embodiments are not limited thereto. For instance, the source driving chips 310_1-310_k may be mounted on the upper region of the non-display region NDA adjacent to the upper side of the display region DA in a chip-on-glass (COG) manner.

Figure 2:
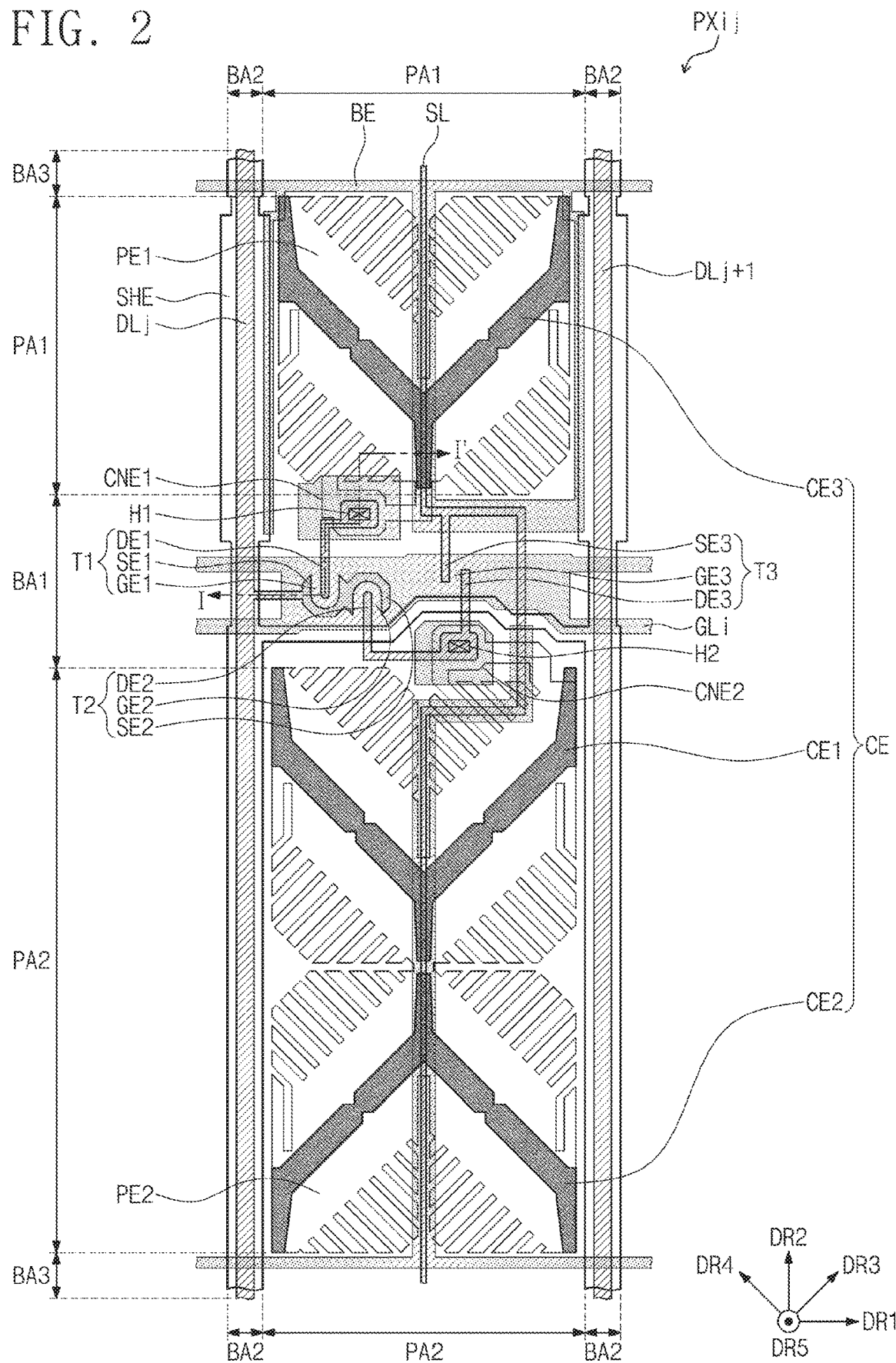
FIG. 2 is a layout diagram illustrating a pixel of the display apparatus of FIG. 1 according to some exemplary embodiments.

FIG. 2 is a layout diagram illustrating a pixel of the display apparatus of FIG. 1 according to some exemplary embodiments.

Although one pixel PXij is illustrated in FIG. 2, other pixels of FIG. 1 may be configured to have the same structure as the pixel PXij shown in FIG. 2. For concise description, the structure of the pixel PXij will be described in more detail below.

Referring to FIG. 2, the pixel PXij may be connected to a corresponding gate line GLi and a corresponding data line DLj. The gate line GLi may extend in a first direction DR1. The data line DLj may extend in a second direction DR2 crossing the first direction DR1. The first direction DR1 may correspond to a row direction, and the second direction DR2 may correspond to a column direction. The fifth direction DR5 may be perpendicular to the first direction DR1 and the second direction DR2.

The pixel PXij may include a first subpixel and a second subpixel. The first subpixel may include a first transistor T1, a first pixel electrode PE1, and a portion of a common electrode CE. The second subpixel may include a second transistor T2, a third transistor T3, a second pixel electrode PE2, and another portion of the common electrode CE.

A region of the first subpixel, which is used to display an image, may be referred to as a first pixel region PA1. A region of the second subpixel, which is used to display an image, may be referred to as a second pixel region PA2. The first pixel electrode PE1 may be provided on (or in) the first pixel region PA1. The second pixel electrode PE2 may be provided on the second pixel region PA2.

The common electrode CE may include first to third common electrodes CE1-CE3. The first and second common electrodes CE1 and CE2 may be included in the second subpixel and may be provided on the second pixel region PA2. The first and second common electrodes CE1 and CE2 may be provided to face the second pixel electrode PE2. The third common electrode CE3 may be included in the first subpixel and may be provided on the first pixel region PA1.

The shapes of the first and second pixel electrodes PE1 and PE2 and the first to third common electrodes CE1-CE3 will be described in more detail below.

A region between the first and second pixel regions PA1 and PA2 of the pixel PXij may be referred to as a first border region BA1. The first border region BA1 may extend in the first direction DR1. The gate line GLi and the first to third transistors T1, T2, and T3 may be provided on the first border region BA1.

A region between the pixels may include a second border region BA2 and a third border region BA3. The second border region BA2 may be provided between the pixels arranged in the first direction DR1 and may extend in the second direction DR2. For example, the second border region BA2 may be provided between the first pixel regions PA1 and between the second pixel regions PA2 in the first direction DR1 and may extend in the second direction DR2. The data lines DLj and DLj+1 may be provided on the second border region BA2.

The third border region BA3 may be provided between the pixels arranged in the second direction DR2 and may extend in the first direction DR1. For example, the third border region BA3 may be provided between the first pixel region PA1 of the pixel PXij and the second pixel region PA2 of another pixel, which is located adjacent to the pixel PXij in the second direction DR2, and may extend in the first direction DR1.

The first border region BA1 and the second border region BA2 may cross each other. The gate line GLi and the data lines DLj and DLj+1 may cross each other at an intersection region between the first border region BA1 and the second border region BA2.

The first transistor T1 of the first subpixel may include a first gate electrode GE1 diverging from the gate line GLi, a first source electrode SE1 diverging from the data line DLj, and a first drain electrode DE1 connected to the first pixel electrode PE1. The first drain electrode DE1 may be extended to be electrically connected to a first connection electrode CNE1, which diverges from the first pixel electrode PE1, through a first contact hole H1.

The second transistor T2 of the second subpixel may include a second gate electrode GE2 diverging from the gate line GLi, a second source electrode SE2 diverging from the data line DLj, and a second drain electrode DE2 connected to the second pixel electrode PE2. The second drain electrode DE2 may be extended to be electrically connected to a second connection electrode CNE2, which diverges from the second pixel electrode PE2, through a second contact hole H2.

The third transistor T3 of the second subpixel may include a third gate electrode GE3 diverging from the gate line GLi, a third source electrode SE3 diverging from a storage line SL, and a third drain electrode DE3 connected to the second pixel electrode PE2. The third drain electrode DE3 may be extended from the second drain electrode DE2. The third drain electrode DE3 may be extended to be electrically connected to the second connection electrode CNE2, which diverges from the second pixel electrode PE2, through the second contact hole H2.

The storage line SL may include portions, which are extended in the second direction DR2 and are overlapped with central portions of the first and second pixel electrodes PE1 and PE2. In addition, the storage line SL may further include portions, which are extended in the first direction DR1 by a specific length near borders between the first and second pixel regions PA1 and PA2 and the first border region BA1, and a portion, which is extended in the second direction DR2 on the first border region BA1. The storage line SL may be provided on (or in) the same layer as the data lines DLj and DLj+1 and may be used to receive a storage voltage.

The display apparatus 500 (e.g., see FIG. 1) may further include a shielding electrode SHE. The shielding electrode SHE may be provided on the first to third border regions BA1-BA3. The shielding electrode SHE may cover the data lines DLj and DLj+1. The shielding electrode SHE may be provided on (or in) the same layer as the first and second pixel electrodes PE1 and PE2 and may be formed of the same material as the first and second pixel electrodes PE1 and PE2. The shielding electrode SHE and the common electrode CE may be configured to receive the same common voltage.

The shielding electrode SHE may be configured to block light incident thereto. Furthermore, the shielding electrode SHE may be configured to prevent the data voltage, which is applied to the data lines DLj and DLj+1, from being electrically coupled with other signal lines and other circuits, which are provided on the shielding electrode SHE.

The display apparatus 500 (e.g., see FIG. 1) may further include a blocking electrode BE. The blocking electrode BE may be provided adjacent to the border of the first pixel electrode PE1. The blocking electrode BE may include a portion that is overlapped with the storage line SL. The blocking electrode BE may be provided on (or in) the same layer as the gate line GLi and may be formed of or include the same material as the gate line GLi.

The blocking electrode BE may be configured to prevent (or reduce) the data lines DLj and DLj+1 from being electrically coupled to the first and second pixel electrodes PE1 and PE2. In addition, the blocking electrode BE may be configured to prevent the storage line SL from being electrically coupled to the first and second pixel electrodes PE1 and PE2.

Figure 3:
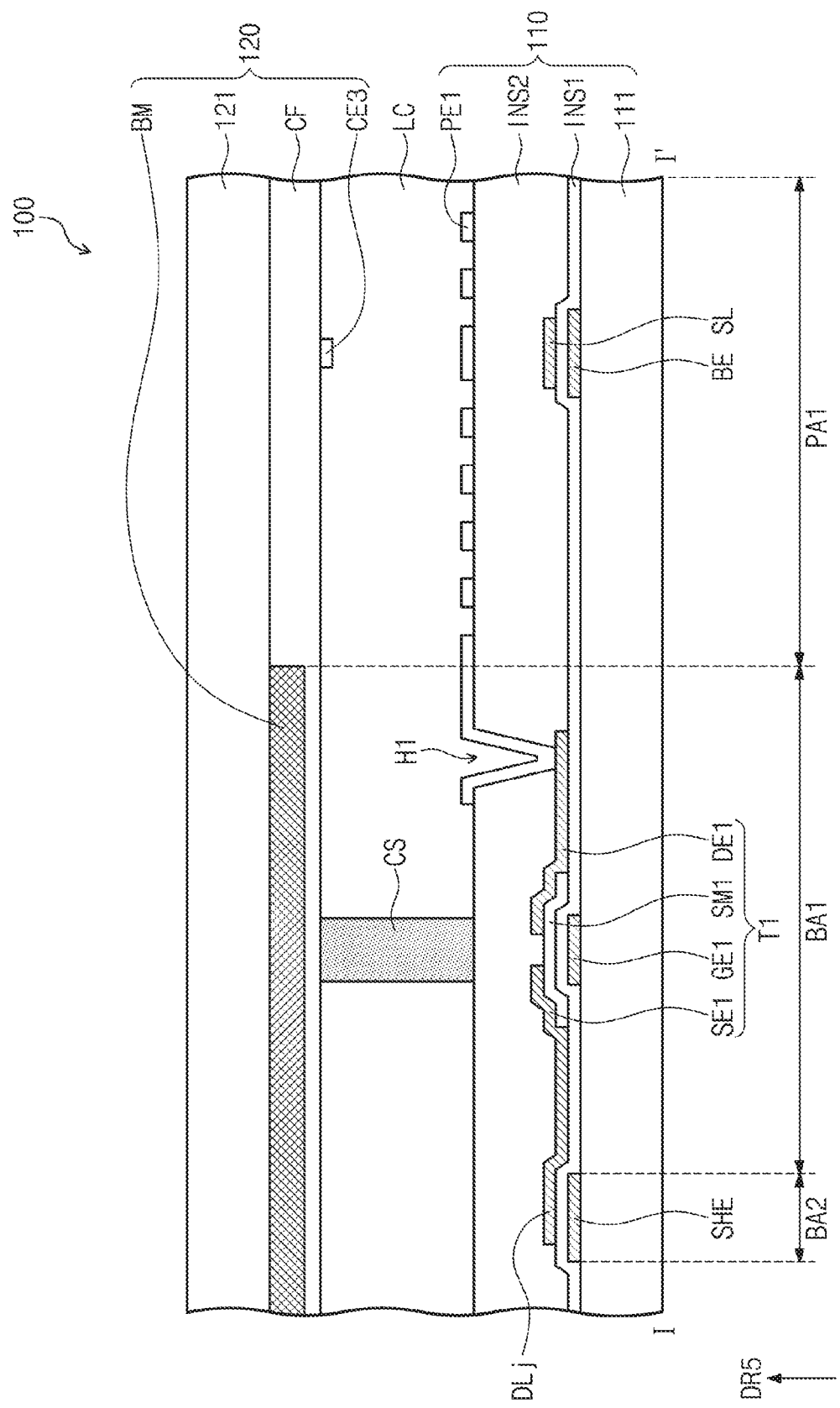
FIG. 3 is a cross-sectional view taken along sectional line I-I' of FIG. 2 according to some exemplary embodiments.

FIG. 3 is a cross-sectional view taken along sectional line I-I' of FIG. 2 according to some exemplary embodiments.

Referring to FIG. 3, the display panel 100 may include a first substrate 110, a second substrate 120 facing the first substrate 110, and a liquid crystal layer LC provided between the first substrate 110 and the second substrate 120.

The first substrate 110 may include a first base substrate 111, the first transistor T1, and the first pixel electrode PE1. The first transistor T1 and the first pixel electrode PE1 may be provided on the first base substrate 111.

Each of the second and third transistors T2 and T3 may be provided to have substantially the same sectional structure as the first transistor T1. Thus, for concise description, the sectional structure of the first transistor T1 will be described in more detail below, but description of the sectional structures of the second and third transistors T2 and T3 will be omitted.

The first gate electrode GE1 of the first transistor T1 may be provided on the first base substrate 111. The first base substrate 111 may be a transparent or opaque insulating substrate. For example, the first base substrate 111 may be at least one of silicon substrate, a glass substrate, and a plastic substrate.

A first insulating layer INS1 may be provided on the first base substrate 111 to cover the first gate electrode GE1. The first insulating layer INS1 may be used as a gate insulating layer. The first insulating layer INS1 may be an inorganic insulating layer, which is formed of or includes an inorganic material.

A first semiconductor layer SM1 of the first transistor T1 may be provided on the first insulating layer INS1 crossing the first gate electrode GE1. Although not shown, the first semiconductor layer SM1 may include an active layer and an ohmic contact layer.

The data lines DLj and DLj+1 may be provided on the first insulating layer INS1 and on the second border region BA2. The storage line SL may be provided on the first insulating layer INS1 and may be overlapped with the first pixel electrode PE1 on the first pixel region PA1.

The first source electrode SE1 and the first drain electrode DE1 of the first transistor T1 may be provided on the first semiconductor layer SM1 and the first insulating layer INS1 to be spaced apart from each other. A portion of the first semiconductor layer SM1, which is located between the first source electrode SE1 and the first drain electrode DE1, may be used as a channel region of the first transistor T1.

A second insulating layer INS2 may be provided on the first insulating layer INS1 to cover the first transistor T1, the data lines DLj and DLj+1, and the storage line SL. The second insulating layer INS2 may be used as a passivation layer. The second insulating layer INS2 may be provided to cover an exposed surface (e.g., top surface) of the first semiconductor layer SM1.

The first pixel electrode PE1 may be provided on the second insulating layer INS2. The first pixel electrode PE1 may be connected to the first drain electrode DE1 of the first transistor T1 through the first contact hole H1, which is formed to penetrate the second insulating layer INS2.

The first pixel electrode PE1 may include a transparent conductive material. For example, the first pixel electrode PE1 may be formed of or include at least one of transparent conductive materials, such as indium tin oxide (ITO), indium zinc oxide (IZO), and indium tin zinc oxide (ITZO); however, exemplary embodiments are not limited thereto.

The second substrate 120 may include a second base substrate 121, a color filter CF, a black matrix BM, and the third common electrode CE3.

The second base substrate 121 may be a transparent or opaque insulating substrate.

The black matrix BM may be provided on a surface of the second base substrate 121. The black matrix BM may be configured to prevent (or reduce) an undesired light from being incident into the first border region BA1 and the second border region BA2. Although not shown, the black matrix BM may further include a portion that is located on the third border region BA3.

The color filter CF may be provided on the black matrix BM. The color filter CF may be configured to allow the corresponding pixel to have a specific color. The color filter CF may be one of a red color filter, a green color filter, and a blue color filter; however, exemplary embodiments are not limited thereto. That is, any suitable color filter may be utilized in association with exemplary embodiments. Every pixel may be configured to have the color filter CF, which may be colored differently in some pixels versus others.

The third common electrode CE3 may be provided below the second base substrate 121 to face the first pixel electrode PE1. For example, the third common electrode CE3 may be provided below the black matrix BM and the color filter CF. The third common electrode CE3 may include a transparent conductive material. For example, the third common electrode CE3 may be formed of or include at least one of transparent conductive materials, such as indium tin oxide (ITO), indium zinc oxide (IZO), and indium tin zinc oxide (ITZO); however, exemplary embodiments are not limited thereto.

The display panel 100 may further include a spacer CS provided between the first substrate 110 and the second substrate 120. The spacer CS may be configured to maintain a specific cell gap between the first substrate 110 and the second substrate 120. The spacer CS may be provided to overlap with the first border region BA1. However, exemplary embodiments are not limited thereto. For instance, the spacer CS may be provided to overlap with the second and third border regions BA2 and BA3 shown in FIG. 2.

Although not shown, a backlight unit may be provided below the display panel 100 and may be used to provide light to the display panel 100. The backlight unit may be formed as at least one of a back (or direct)-lit and an edge-lit type, however, exemplary embodiments are not limited thereto.

Figure 4:
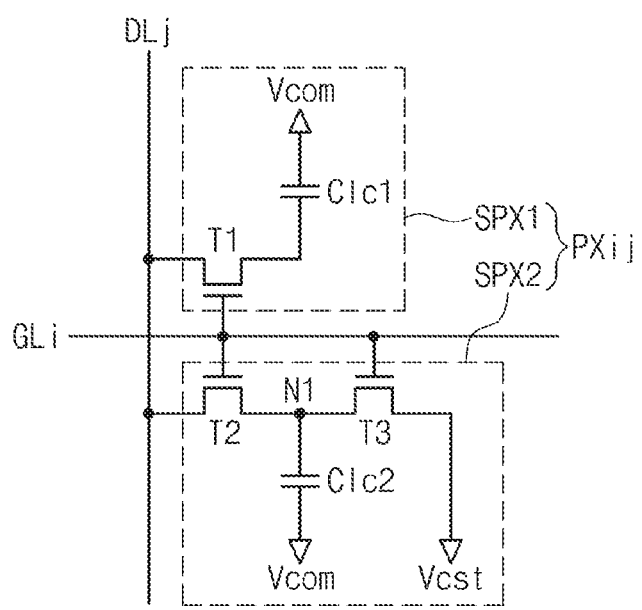
FIG. 4 is an equivalent circuit diagram of a pixel shown in FIG. 2 according to some exemplary embodiments.

FIG. 4 is an equivalent circuit diagram of a pixel shown in FIG. 2 according to some exemplary embodiments.

Referring to FIGS. 2 and 4, the pixel PXij may include a first subpixel SPX1 and a second subpixel SPX2.

The first subpixel SPX1 may include the first transistor T1 and a first liquid crystal capacitor Clc1. The first transistor T1 may include the first gate electrode GE1 connected to a corresponding gate line (e.g., GLi), the first source electrode SE1 connected to a corresponding data line (e.g., DLj), and the first drain electrode DE1 connected to the first liquid crystal capacitor Clc1.

As described above, the first drain electrode DE1 of the first transistor T1 may be connected to the first pixel electrode PE1. The first liquid crystal capacitor Clc1 may be composed of the first pixel electrode PE1 and the third common electrode CE3, which are spaced apart from each other with the liquid crystal layer LC interposed therebetween.

The second subpixel SPX2 may include the second transistor T2, the third transistor T3, and a second liquid crystal capacitor Clc2. The second transistor T2 may include the second gate electrode GE2 connected to the corresponding gate line GLi, the second source electrode SE2 connected to the corresponding data line DLj, and the second drain electrode DE2 connected to the second liquid crystal capacitor Clc2.

As described above, the second drain electrode DE2 of the second transistor T2 may be connected to the second pixel electrode PE2. The second liquid crystal capacitor Clc2 may be composed of the second pixel electrode PE2 and the first and second common electrodes CE1 and CE2, which are spaced apart from each other with the liquid crystal layer LC interposed therebetween.

The third transistor T3 may include the third gate electrode GE3, the third source electrode SE3, and the third drain electrode DE3. The third gate electrode GE3 may be connected to the corresponding gate line GLi, and the third source electrode SE3 may be applied with a storage voltage Vcst. The third drain electrode DE3, along with the second drain electrode DE2 of the second transistor T2, may be connected in common to the second liquid crystal capacitor C1c2.

As described above, the third drain electrode DE3 of the third transistor T3, along with the second drain electrode DE2, may be connected in common to the second pixel electrode PE2. In addition, the third source electrode SE3 may be formed to have a shape diverging from the storage line SL. The storage line SL may be provided with the storage voltage Vcst.

The gate signal applied to the gate line GLi may be used to turn on the first to third transistors T1, T2, and T3. If the first transistor T1 is turned on, the data voltage may be applied to the first subpixel SPX1 through the first transistor T1. For example, the data voltage applied to the data line DLj may be applied to the first pixel electrode PE1 of the first subpixel SPX1 through the first transistor T1 in the turned-on state.

The first liquid crystal capacitor Clc1 may be charged with a first pixel voltage, which is determined by the data voltage. For example, the first liquid crystal capacitor Clc1 may be charged with the first pixel voltage, which is determined by a voltage difference between the data voltage and a common voltage Vcom applied to the first pixel electrode PE1 and the third common electrode CE3, respectively. Thus, the first subpixel SPX1 may be charged with the first pixel voltage.

If the second transistor T2 is turned on, the data voltage may be applied to the second subpixel SPX2 through the second transistor T2. Furthermore, if the third transistor T3 is turned on, the storage voltage Vcst may be applied to the second subpixel SPX2 through the third transistor T3.

A voltage range of the data voltage may be set to be larger than a voltage range of the storage voltage Vcst. The common voltage Vcom may be set to have a median value of the voltage range of the data voltage. An absolute value of a voltage difference between the data voltage and the common voltage Vcom may be set to be larger than an absolute value of a voltage difference between the storage voltage Vcst and the common voltage Vcom.

A node N1 between the second and third transistors T2 and T3 may have a voltage that is determined or divided by electrical resistances of the second and third transistors T2 and T3 in the turned-on state. For example, the voltage of the node N1 between the second and third transistors T2 and T3 may have approximately a medium voltage between the data voltage and the storage voltage Vcst, which are respectively provided through the second and third transistors T2 and T3 that are in the turned-on state.

The voltage of the node N1 between the second and third transistors T2 and T3 may be applied to the second pixel electrode PE2. For example, a voltage corresponding to the medium value between the data voltage and the storage voltage Vcst may be applied to the second pixel electrode PE2.

The second liquid crystal capacitor C1c2 may be charged with a second pixel voltage, which is determined by a voltage difference between the voltage applied to the second pixel electrode PE2 and the common voltage Vcom applied to the first and second common electrodes CE1 and CE2. For example, the second liquid crystal capacitor C1c2 may be charged with the second pixel voltage, which is smaller than the first pixel voltage. Thus, the second subpixel SPX2 may be charged with the second pixel voltage, which is smaller than the first pixel voltage.

In the case where the first and second subpixels SPX1 and SPX2 of the pixel PXij are charged with the first and second pixel voltages that are different from each other, the display apparatus 500 may have a gradation level corresponding to a medium value between the first and second pixel voltages, when viewed by a user. In this case, it may be possible to prevent (or reduce) deterioration of a lateral viewing angle, which may be caused by distortion of a gamma curve at a level lower than the medium gradation level, and thereby to improve lateral visibility of the display apparatus 500.

Figure 5:
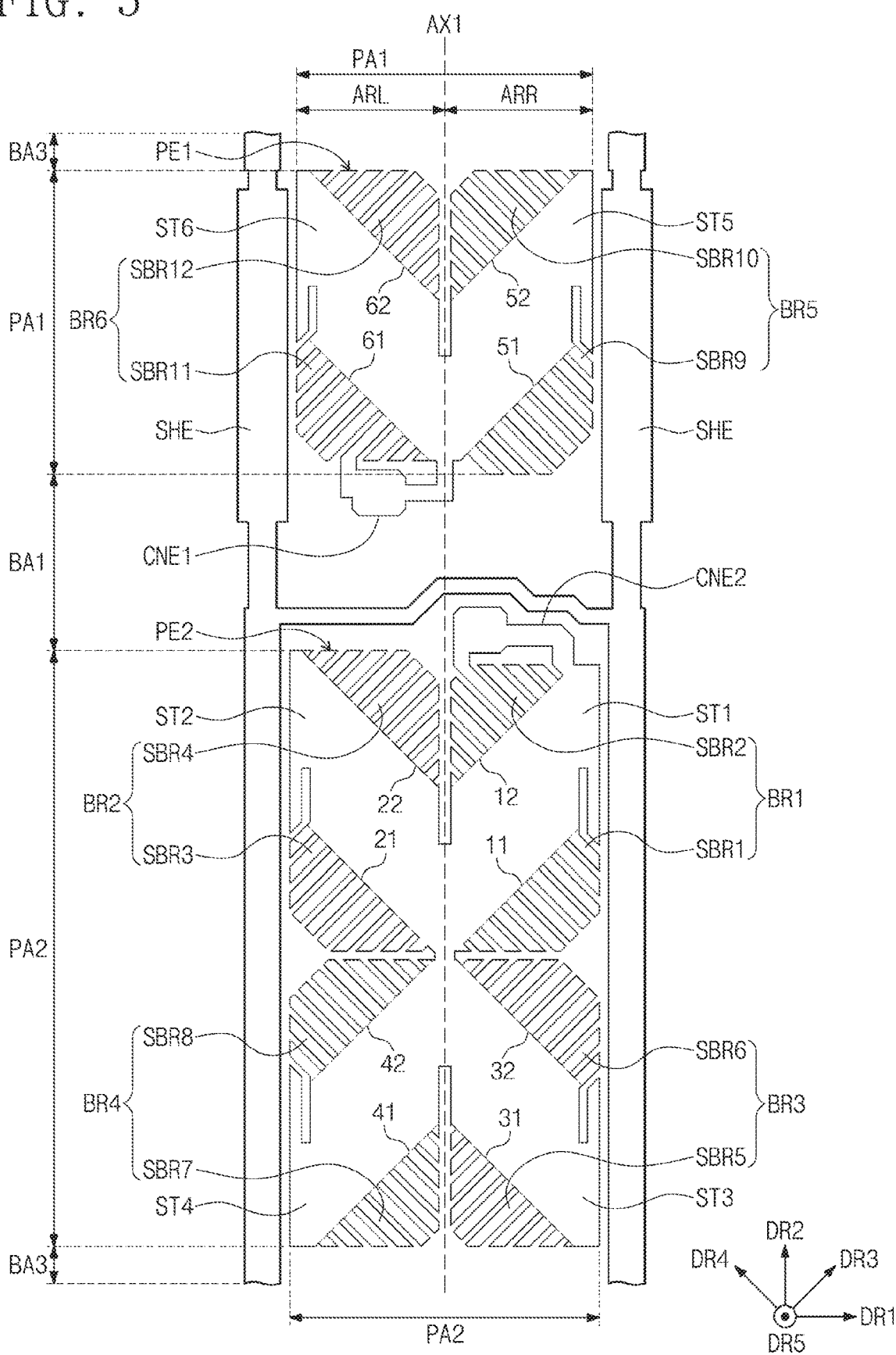
FIG. 5 is a plan view illustrating pixel electrodes and shielding electrodes of a pixel according to some exemplary embodiments.
Figure 6:
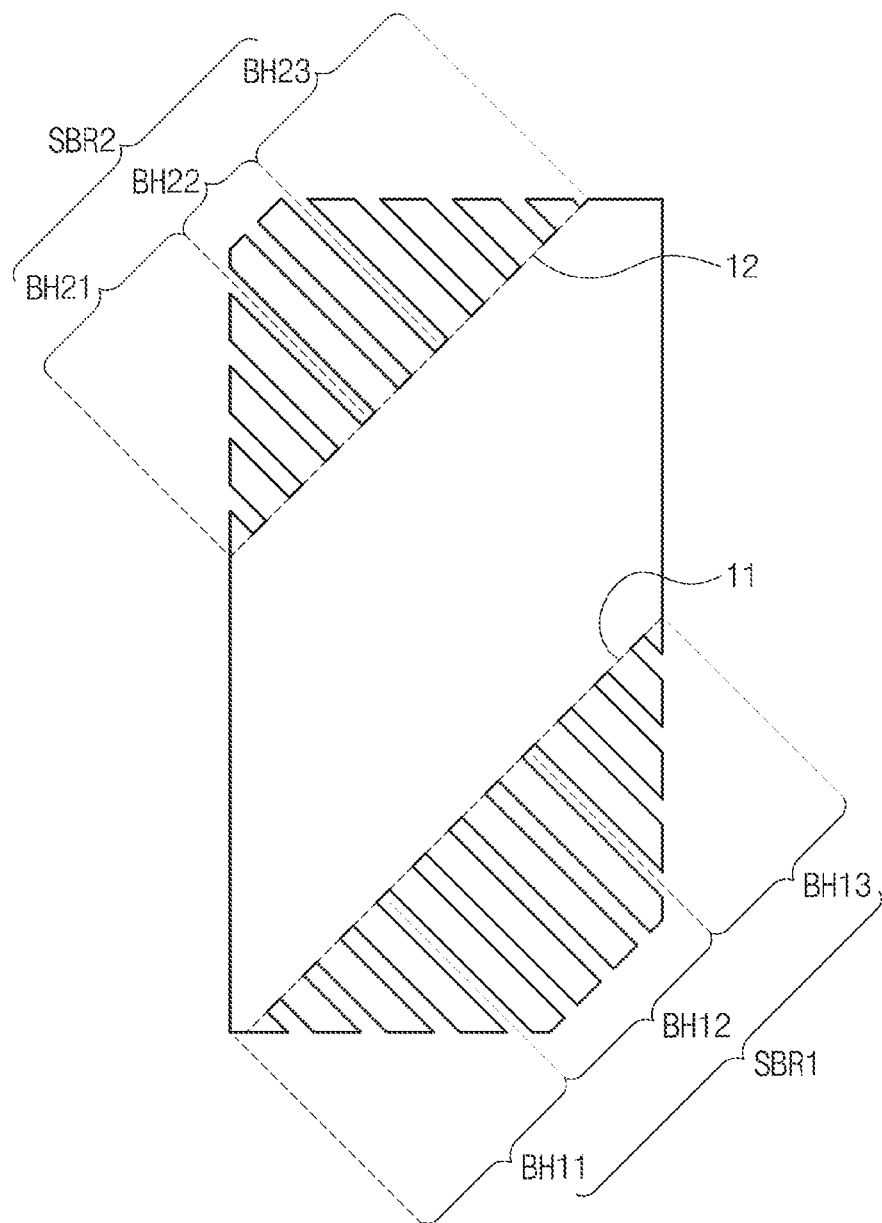
FIG. 6 is an enlarged plan view illustrating a first stem portion and a first branch portion of a second pixel electrode according to some exemplary embodiments.
Figure 6:
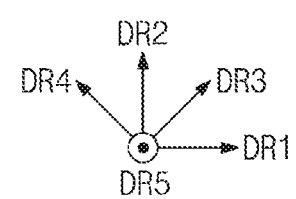
Figure 7:
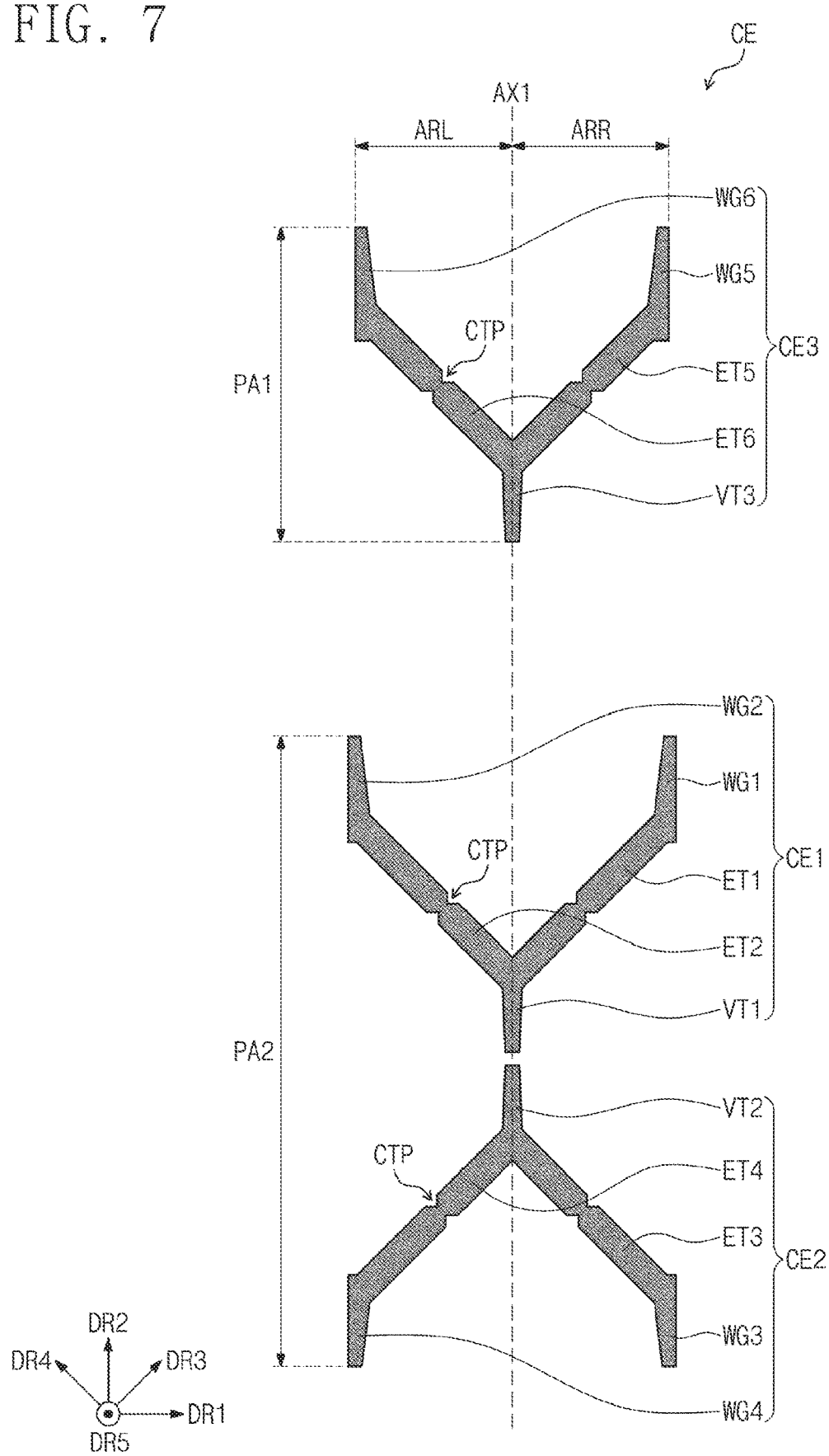
FIG. 7 is a plan view illustrating a common electrode of a pixel according to some exemplary embodiments.

FIG. 5 is a plan view illustrating pixel electrodes and shielding electrodes of a pixel according to some exemplary embodiments. FIG. 6 is an enlarged plan view illustrating a first stem portion and a first branch portion of a second pixel electrode according to some exemplary embodiments. FIG. 7 is a plan view illustrating a common electrode of a pixel according to some exemplary embodiments.

The shape of the pixel electrode will be described in more detail with reference to FIGS. 2, 5, and 6.

Based on an imaginary line AX1, which passes through a center between two data lines and is parallel to the second direction DR2, a left region ARL and a right region ARR may be defined in a region between two data lines (e.g., the data lines DLj and DLj+1) adjacent to each other in the first direction DR1. The left region ARL and the right region ARR may be regions that are defined in the first and second pixel regions PA1 and PA2.

A third direction DR3 and a fourth direction DR4 may be defined to cross the first direction DR1 and the second direction DR2. A plane defined by the first direction DR1 and the second direction DR2 may be divided into quadrants, and here, the third direction DR3 may be a direction oriented from an origin of the plane (e.g., an intersection point of the first and second directions DR1 and DR2) toward a point in the first quadrant. The fourth direction DR4 may be a direction oriented from the origin of the plane toward a point in the second quadrant. The third direction DR3 and the fourth direction DR4 may be orthogonal to each other.

The first pixel electrode PE1 and the second pixel electrode PE2 may be spaced apart from each other in the second direction DR2. The second pixel electrode PE2 may have an area (e.g., surface area) larger than that of the first pixel electrode PE1.

The second pixel electrode PE2 may include first to fourth stem portions ST1-ST4 and first to fourth branch portions BR1-BR4.

The first stem portion ST1 may be provided on the right region ARR and may extend in the third direction DR3. The first stem portion ST1 may have two opposite sides 11 and 12 extending in the third direction DR3.

The second stem portion ST2 may be adjacent to the first stem portion ST1 in the first direction DR1. The second stem portion ST2 may be provided on the left region ARL and may extend in the fourth direction DR4. The second stem portion ST2 may have two opposite sides 21 and 22 extending in the fourth direction DR4.

The third stem portion ST3 may be adjacent to the first stem portion ST1 in the second direction DR2. The third stem portion ST3 may be provided on the right region ARR and may extend in the fourth direction DR4. The third stem portion ST3 may have two opposite sides 31 and 32 extending in the fourth direction DR4. The third stem portion ST3 may be spaced apart from the first pixel electrode PE1, and the first stem portion ST1 may be provided between the third stem portion ST3 and the first pixel electrode PE1.

The fourth stem portion ST4 may be adjacent to the second stem portion ST2 in the second direction DR2. The fourth stem portion ST4 may be provided on the left region ARL and may extend in the third direction DR3. The fourth stem portion ST4 may have two opposite sides 41 and 42 extending in the third direction DR3. The fourth stem portion ST4 may be spaced apart from the first pixel electrode PE1, and the second stem portion ST2 may be provided between the fourth stem portion ST4 and the first pixel electrode PE1.

The first to fourth stem portions ST1-ST4 may be connected to each other at a region adjacent to the imaginary line AX1. Each of the first to fourth stem portions ST1-ST4 may be shaped like a parallelogram. Further, the first and third stem portions ST1 and ST3 and the second and fourth stem portions ST2 and ST4 may be symmetric about a line extending in the first direction DR1.

The first and second stem portions ST1 and ST2 may be connected to each other to form a "V"-shaped structure. The first and second stem portions ST1 and ST2 may cover (or overlap with) the first common electrode CE1.

The third and fourth stem portions ST3 and ST4 may be connected to each other to form an inverted "V"-shaped structure. The third and fourth stem portions ST3 and ST4 may cover the second common electrode CE2.

The first branch portions BR1 may protrude, in the fourth direction DR4, from the side of the first stem portion ST1 extending in the third direction DR3. The first branch portions BR1 may include a plurality of patterns that are spaced apart from each other. For example, the patterns in each of the first branch portions BR1 may be spaced apart from each other by a distance of several micrometers, thereby forming a plurality of fine slits.

The first branch portions BR1 may include a first sub-branch portion SBR1 and a second sub-branch portion SBR2, which protrude from respective ones of the two opposite sides 11 and 12 of the first stem portion ST1 extending in the third direction DR3.

The first sub-branch portion SBR1 may include first lengthening branches BH11, first constant branches BH12, and first shortening branches BH13, which are sequentially arranged in the third direction DR3.

Lengths of the first lengthening branches BH11 in the fourth direction DR4 may increase in a direction from an end of the side 11 of the first stem portion ST1 toward an opposite end. The first constant branches BH12 may have a constant length in the fourth direction DR4. The first constant branches BH12 may be provided between the first lengthening branches BH11 and the first shortening branches BH13 in the third direction DR3. Lengths of the first shortening branches BH13 in the fourth direction DR4 may decrease in a direction from the end of the side 11 of the first stem portion ST1 toward the opposite end.

The second sub-branch portion SBR2 may include second lengthening branches BH21, second constant branches BH22, and second shortening branches BH23, which are sequentially arranged in the third direction DR3. The second lengthening branches BH21, the second constant branches BH22, and the second shortening branches BH23 may have shapes similar to the first lengthening branches BH11, the first constant branches BH12, and the first shortening branches BH13, and thus, a detailed description thereof will be omitted for brevity's sake.

The second branch portions BR2 may protrude, in the third direction DR3, from the side of the second stem portion ST2 extending in the fourth direction DR4. The second branch portions BR2 may include a plurality of patterns that are spaced apart from each other.

The second branch portions BR2 may include a third sub-branch portion SBR3 and a fourth sub-branch portion SBR4, which protrude from respective ones of the two opposite sides 21 and 22 of the second stem portion ST2 extending in the fourth direction DR4. Each of the third sub-branch portion SBR3 and the fourth sub-branch portion SBR4 may have substantially the same shape as a corresponding one of the first sub-branch portion SBR1 and the second sub-branch portion SBR2, and thus, a detailed description thereof will be omitted for brevity's sake.

The third branch portions BR3 may protrude, in the third direction DR3, from the side of the third stem portion ST3 extending in the fourth direction DR4. The third branch portions BR3 may include a plurality of patterns that are spaced apart from each other.

The third branch portions BR3 may include a fifth sub-branch portion SBR5 and a sixth sub-branch portion SBR6, which protrude from respective ones of the two opposite sides 31 and 32 of the third stem portion ST3 extending in the fourth direction DR4. Each of the fifth sub-branch portion SBR5 and the sixth sub-branch portion SBR6 may have substantially the same shape as a corresponding one of the first sub-branch portion SBR1 and the second sub-branch portion SBR2, and thus, a detailed description thereof will be omitted for brevity's sake.

The fourth branch portions BR4 may protrude, in the fourth direction DR4, from the side of the fourth stem portion ST4 extending in the third direction DR3. The fourth branch portions BR4 may include a plurality of patterns that are spaced apart from each other.

The fourth branch portions BR4 may include a seventh sub-branch portion SBR7 and an eighth sub-branch portion SBR8, which protrude from respective ones of the two opposite sides 41 and 42 of the fourth stem portion ST4 extending in the third direction DR3. Each of the seventh sub-branch portion SBR7 and the eighth sub-branch portion SBR8 may have substantially the same shape as a corresponding one of the first sub-branch portion SBR1 and the second sub-branch portion SBR2, and thus, a detailed description thereof will be omitted for brevity's sake.

The first pixel electrode PE1 may include fifth and sixth stem portions ST5 and ST6 and fifth and sixth branch portions BR5 and BR6.

The fifth stem portion ST5 may be provided on the right region ARR and may extend in the third direction DR3. The fifth stem portion ST5 may have two opposite sides 51 and 52 extending in the third direction DR3.

The sixth stem portion ST6 may be adjacent to the fifth stem portion ST5 in the first direction DR1. The sixth stem portion ST6 may be provided on the left region ARL and may extend in the fourth direction DR4. The sixth stem portion ST6 may have two opposite sides 61 and 62 extending in the fourth direction DR4.

The fifth stem portion ST5 and the sixth stem portion ST6 may be connected to each other at a region adjacent to (or overlapping) the imaginary line AX1. The fifth and sixth stem portions ST5 and ST6 connected to each other may have a shape that is substantially similar to the shape of the first and second stem portions ST1 and ST2 connected to each other.

The fifth and sixth stem portions ST5 and ST6 may be connected to each other to form a "V"-shaped structure. The fifth and sixth stem portions ST5 and ST6 may cover the third common electrode CE3.

The fifth branch portions BR5 may include a ninth sub-branch portion SBR9 and a tenth sub-branch portion SBR10, which protrude from respective ones of the two opposite sides 51 and 52 of the fifth stem portion ST5. Each of the ninth sub-branch portion SBR9 and the tenth sub-branch portion SBR10 may have substantially the same shape as a corresponding one of the first sub-branch portion SBR1 and the second sub-branch portion SBR2, and thus, a detailed description thereof will be omitted for brevity's sake.

The sixth branch portions BR6 may include an eleventh sub-branch portion SBR11 and a twelfth sub-branch portion SBR12, which protrude from respective ones of the two opposite sides 61 and 62 of the sixth stem portion ST6. Each of the eleventh sub-branch portion SBR11 and the twelfth sub-branch portion SBR12 may have substantially the same shape as a corresponding one of the first sub-branch portion SBR1 and the second sub-branch portion SBR2, and thus, a detailed description thereof will be omitted for brevity's sake.

Referring to FIGS. 5 and 7, the common electrode CE may include the first to third common electrodes CE1-CE3. The first common electrode CE1 and the second common electrode CE2 may be provided on the second pixel region PA2 to be overlapped with the second pixel electrode PE2, and the third common electrode CE3 may be provided on the first pixel region PA1 to be overlapped with the first pixel electrode PE1.

The first common electrode CE1 may include a first extended portion ET1 and a second extended portion ET2.

The first extended portion ET1 may be provided on the right region ARR, may be overlapped with the first stem portion ST1, and may extend in the third direction DR3. The second extended portion ET2 may be provided on the left region ARL, may be overlapped with the second stem portion ST2, and may extend in the fourth direction DR4. The first extended portion ET1 and the second extended portion ET2 may be connected to each other at a region adjacent to the imaginary line AX1. An end of the first extended portion ET1 and an end of the second extended portion ET2 may be connected to each other to have a 'V' shape.

A cut pattern CTP may be provided in the first and second extended portions ET1 and ET2. For example, the cut pattern CTP may be provided in opposite sides of each of the first and second extended portions ET1 and ET2. The cut pattern CTP may be provided to reduce a width of each of the first and second extended portions ET1 and ET2.

The first common electrode CE1 may further include a first wing portion WG1, a second wing portion WG2, and a first vertically extended portion VT1.

The first wing portion WG1 may be extended from an opposite end of the first extended portion ET1 that is relatively far from the imaginary line AX1. The first wing portion WG1 may be provided on the right region ARR and may be overlapped with the first stem portion ST1. The first wing portion WG1 may extend in the second direction DR2. The first wing portion WG1 may be connected to the first extended portion ET1 at an obtuse angle.

The second wing portion WG2 may be extended from an opposite end of the second extended portion ET2 that is relatively far from the imaginary line AX1. The second wing portion WG2 may be provided on the left region ARL and may be overlapped with the second stem portion ST2. The second wing portion WG2 may extend in the second direction DR2. The second wing portion WG2 may be connected to the second extended portion ET2 at an obtuse angle.

The first vertically extended portion VT1 may extend in the second direction DR2 from ends of the first and second extended portions ET1 and ET2 that are connected to each other. The first vertically extended portion VT1 may be connected to each of the first and second extended portions ET1 and ET2 at an obtuse angle.

The second common electrode CE2 and the first common electrode CE1 may have shapes that are symmetric to each other about an imaginary line extending in the first direction DR1.

The second common electrode CE2 may include a third extended portion ET3, a fourth extended portion ET4, a third wing portion WG3, a fourth wing portion WG4, and a second vertically extended portion VT2.

The third extended portion ET3 may be provided on the right region ARR, may be overlapped with the third stem portion ST3, and may extend in the fourth direction DR4. The fourth extended portion ET4 may be provided on the left region ARL, may be overlapped with the fourth stem portion ST4, and may extend in the third direction DR3. An end of the third extended portion ET3 and an end of the fourth extended portion ET4 may be connected to each other at a region adjacent to the imaginary line AX1. The third extended portion ET3 and the fourth extended portion ET4 may be connected to each other to form an inverted "V"-shaped structure.

The cut pattern CTP may be provided in the third extended portion ET3 and the fourth extended portion ET4. The cut pattern CTP may have substantially the same shape as the cut pattern CTP formed in the first and second extended portions ET1 and ET2, and thus, a detailed description will be omitted.

The third wing portion WG3 may be extended from an opposite end of the third extended portion ET3 that is relatively far from the imaginary line AX1. The third wing portion WG3 may be provided on the right region ARR and may be overlapped with the third stem portion ST3. The third wing portion WG3 may extend in the second direction DR2. The third wing portion WG3 may be connected to the third extended portion ET3 at an obtuse angle.

The fourth wing portion WG4 may be extended from an opposite end of the fourth extended portion ET4 that is relatively far from the imaginary line AX1. The fourth wing portion WG4 may be provided on the left region ARL and may be overlapped with the fourth stem portion ST4. The fourth wing portion WG4 may extend in the second direction DR2. The fourth wing portion WG4 may be connected to the fourth extended portion ET4 at an obtuse angle.

The second vertically extended portion VT2 may extend in the second direction DR2 from ends of the third and fourth extended portions ET3 and ET4 that are connected to each other. The second vertically extended portion VT2 may be connected to each of the third and fourth extended portions ET3 and ET4 at an obtuse angle.

The third common electrode CE3 may have substantially the same shape as the first common electrode CE1. The third common electrode CE3 may include a fifth extended portion ET5, a sixth extended portion ET6, a fifth wing portion WG5, a sixth wing portion WG6, and a third vertically extended portion VT3.

The fifth extended portion ET5 may be provided on the right region ARR, may be overlapped with the fifth stem portion ST5, and may extend in the third direction DR3. The sixth extended portion ET6 may be provided on the left region ARL, may be overlapped with the sixth stem portion ST6, and may extend in the fourth direction DR4. The fifth and sixth extended portions ET5 and ET6 may be connected to each other at a region adjacent to the imaginary line AX1. An end of the fifth extended portion ET5 and an end of the sixth extended portion ET6 may be connected to each other to have a "V" shape.

The cut pattern CTP may be provided in the fifth and sixth extended portions ET5 and ET6. The cut pattern CTP may have substantially the same shape as the cut pattern CTP formed in the first and second extended portions ET1 and ET2, and thus, a detailed description will be omitted.

The fifth wing portion WG5 may be extended from an opposite end of the fifth extended portion ET5 that is relatively far from the imaginary line AX1. The fifth wing portion WG5 may be provided on the right region ARR and may be overlapped with the fifth stem portion ST5. The fifth wing portion WG5 may extend in the second direction DR2. The fifth wing portion WG5 may be connected to the fifth extended portion ET5 at an obtuse angle.

The sixth wing portion WG6 may be extended from an opposite end of the sixth extended portion ET6 that is relatively far from the imaginary line AX1. The sixth wing portion WG6 may be provided on the left region ARL and may be overlapped with the sixth stem portion ST6. The sixth wing portion WG6 may extend in the second direction DR2. The sixth wing portion WG6 may be connected to the sixth extended portion ET6 at an obtuse angle.

The third vertically extended portion VT3 may extend in the second direction DR2 from ends of the fifth and sixth extended portions ET5 and ET6 that are connected to each other. The third vertically extended portion VT3 may be connected to each of the fifth and sixth extended portions ET5 and ET6 at an obtuse angle.

Figure 8:
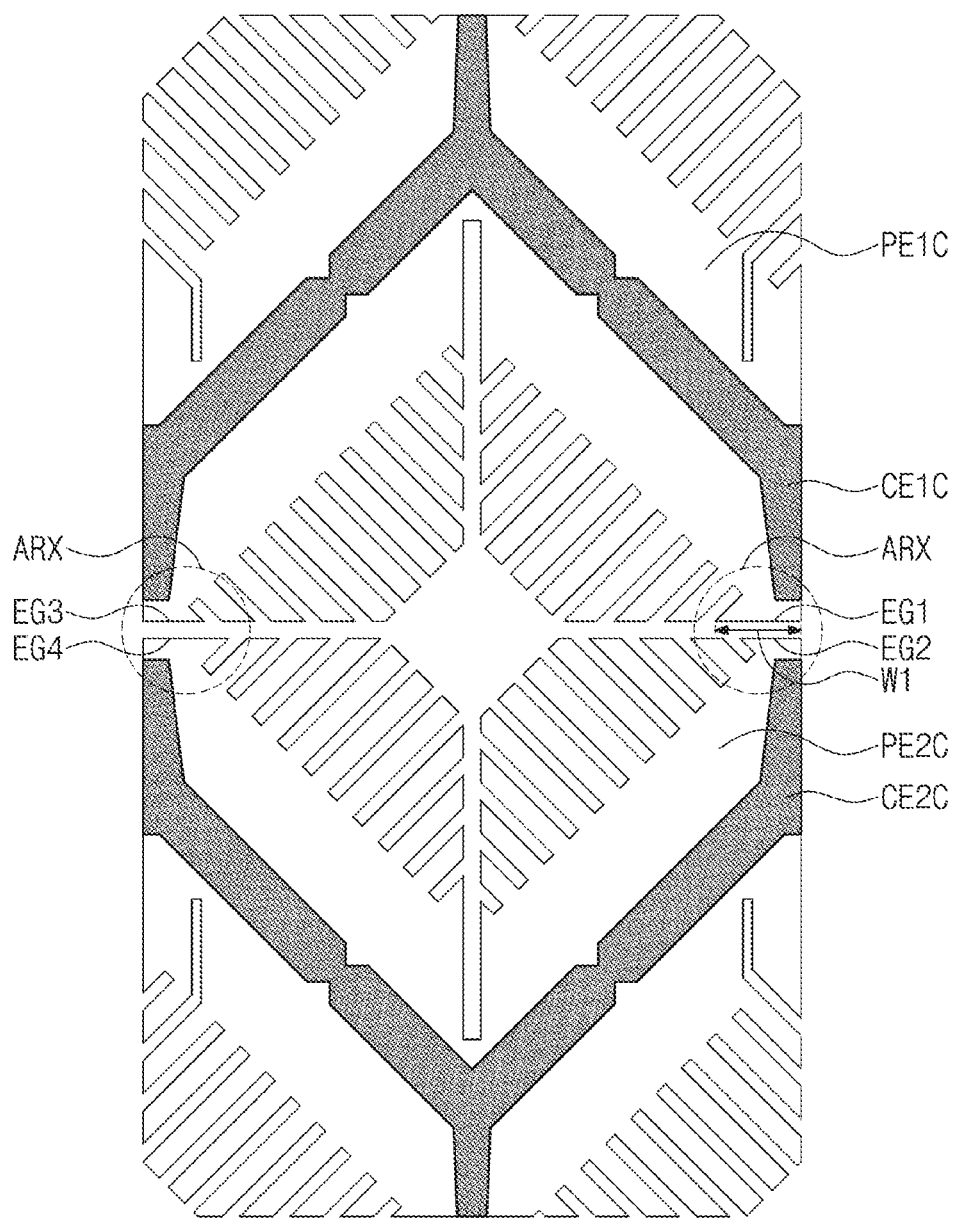
FIG. 8 is a plan view illustrating portions of pixel electrodes and common electrodes according to a comparative example.

FIG. 8 is a plan view illustrating portions of pixel electrodes and common electrodes according to a comparative example. To provide better understanding of technical effects of the display apparatus described with reference to FIGS. 1 to 7, a display apparatus according to a comparative example will be described with reference to FIG. 8.

FIG. 8 illustrates first and second comparative pixel electrodes PE1C and PE2C and first and second comparative common electrodes CE1C and CE2C, which correspond to those of the second pixel region PA2 of FIGS. 5 to 7.

Referring to FIG. 8, the display apparatus according to the comparative example may differ from the display apparatus described with reference to FIGS. 1 to 7 in that positions of two portions of the second pixel electrode PE2 are reversed. For example, a portion of the second pixel electrode PE2 including the first and second stem portions ST1 and ST2 and the first and second branch portions BR1 and BR2 may be located at a position for another portion of the second pixel electrode PE2 including the third and fourth stem portions ST3 and ST4 and the third and fourth branch portions BR3 and BR4, and vice versa.

As shown in FIG. 8, the first comparative pixel electrode PE1C may have substantially the same shape as a portion including the third and fourth stem portions ST3 and ST4 and the third and fourth branch portions BR3 and BR4, which are illustrated to be connected to each other in FIG. 5. Similarly, the second comparative pixel electrode PE2C may have substantially the same shape as a portion including the first and second stem portions ST1 and ST2 and the first and second branch portions BR1 and BR2, which are illustrated to be connected to each other in FIG. 5.

Similarly, the first and second comparative common electrodes CE1C and CE2C may differ from the display apparatus described with reference to FIGS. 1 to 7 in that positions of the first and second common electrodes CE1 and CE2 are reversed.

Referring to FIG. 8, in a stain region ARX, the first comparative pixel electrode PE1C and the second comparative pixel electrode PE2C may have edges EG1-EG4 extending in the first direction DR1. When measured in the first direction DR1, the edges EG1-EG4 may have a length of 7.5 µm or greater. A region near the edges EG1-EG4 of the first and second comparative pixel electrodes PE1C and PE2C may be defined as the stain region ARX. In the stain region ARX, it may be difficult to control alignment of liquid crystal molecules, and this may lead to a difference between frontal and lateral brightness characteristics and a consequent recognizable stain.

In the display apparatus according to some exemplary embodiments, the first and second pixel electrodes PE1 and PE2 may not have an edge having a length of 7.5 µm or greater or may have such an edge at a region adjacent to the first to third border regions BA1-BA3 when measured in the first direction DR1. As such, the display apparatus according to some exemplary embodiments may be configured to reduce a difference between frontal and lateral brightness characteristics in the first and second pixel regions PA1 and PA2 that may otherwise be caused by shapes of the comparative pixel and common electrodes PE1C, PE2C, CE1C, and CE2C, and thereby to have an improved display quality without a recognizable stain issue.

Figure 9:
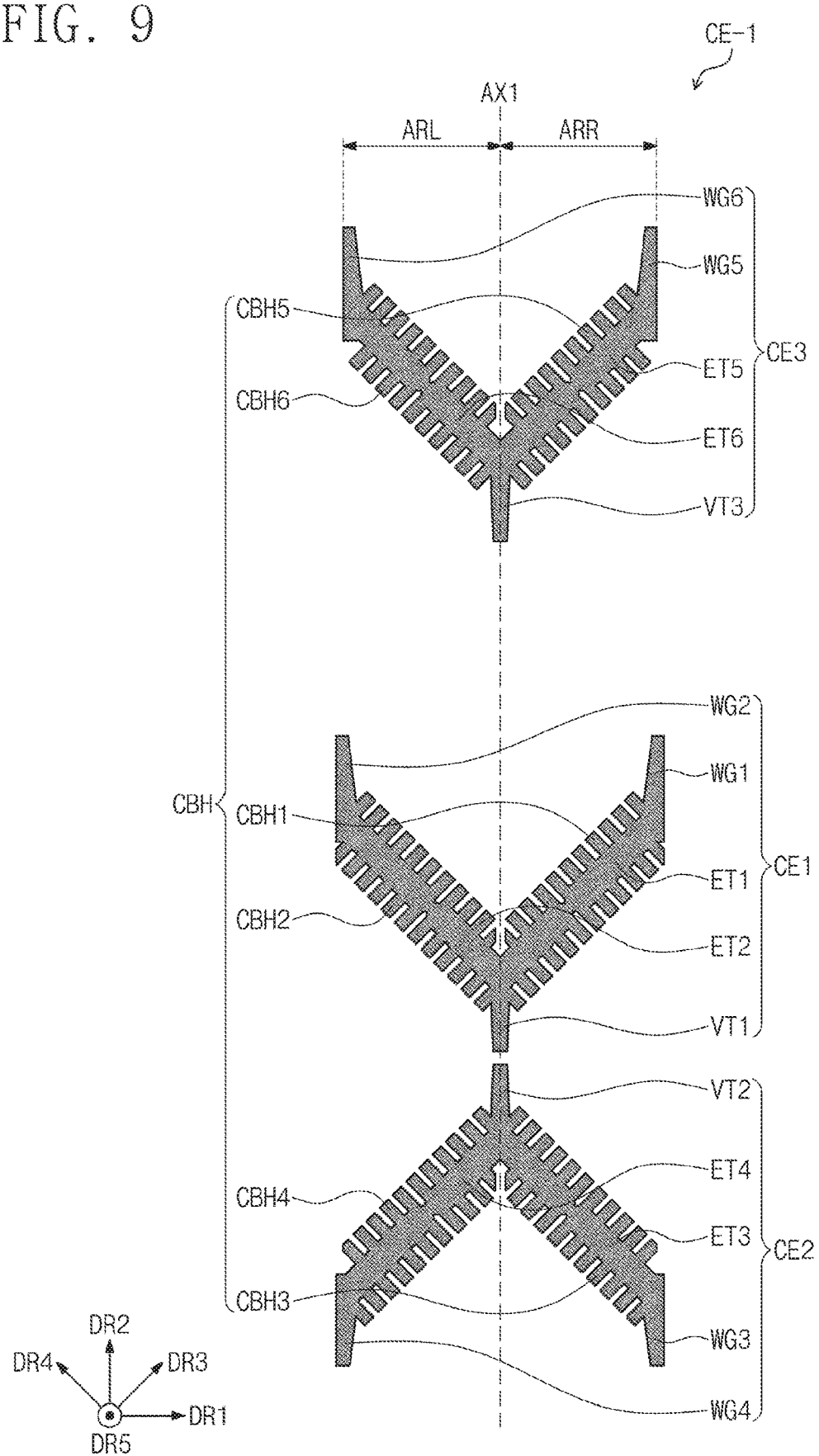
FIG. 9 is a plan view illustrating a common electrode of a pixel according to some exemplary embodiments.

FIG. 9 is a plan view illustrating a common electrode of a pixel according to some exemplary embodiments.

A common electrode CE-1 of FIG. 9 may further include an extended branch portion CBH, which is not provided in the common electrode CE of described with reference to FIG. 7. In the following description of the common electrode CE-1, a previously-described element of the common electrode CE shown in FIG. 7 will be identified by the same reference number without repeating an overlapping description thereof for concise description.

The extended branch portion CBH may include first to sixth extended branch portions CBH1-CBH6.

The first extended branch portions CBH1 may be connected to the first extended portion ET1 and may be extended in the fourth direction DR4. In some exemplary embodiments, a plurality of the first extended branch portions CBH1 may be provided to form a plurality of fine slits spaced apart from each other by a distance of several micrometers.

The second extended branch portions CBH2 may be connected to the second extended portion ET2 and may be extended in the third direction DR3. In some exemplary embodiments, a plurality of the second extended branch portions CBH2 may be provided to form a plurality of fine slits spaced apart from each other by a distance of several micrometers.

The third extended branch portions CBH3 may be connected to the third extended portion ET3 and may be extended in the third direction DR3. In some exemplary embodiments, a plurality of the third extended branch portions CBH3 may be provided to form a plurality of fine slits spaced apart from each other by a distance of several micrometers.

The fourth extended branch portions CBH4 may be connected to the fourth extended portion ET4 and may be extended in the fourth direction DR4. In some exemplary embodiments, a plurality of the fourth extended branch portions CBH4 may be provided to form a plurality of fine slits spaced apart from each other by a distance of several micrometers.

The fifth extended branch portions CBH5 may be connected to the fifth extended portion ET5 and may be extended in the fourth direction DR4. In some exemplary embodiments, a plurality of the fifth extended branch portions CBH5 may be provided to form a plurality of fine slits spaced apart from each other by a distance of several micrometers.

The sixth extended branch portions CBH6 may be connected to the sixth extended portion ET6 and may be extended in the third direction DR3. In some exemplary embodiments, a plurality of the sixth extended branch portions CBH6 may be provided to form a plurality of fine slits spaced apart from each other by a distance of several micrometers.

According to various exemplary embodiments, a display apparatus may be configured to prevent (or at least reduce) shapes of pixel and common electrodes from causing a difference between frontal and lateral brightness characteristics in a display region, and thereby, to prevent (or at least reduce) a stain from being recognized by a user.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:
1. A display apparatus, comprising:
a gate line extending in a first direction;
data lines extending in a second direction crossing the first direction; and
a pixel connected to the gate line and a corresponding data line of the data lines,
wherein the pixel comprises:
a first pixel electrode;
a second pixel electrode spaced apart from the first pixel electrode in the second direction; and
a common electrode facing the first and second pixel electrodes,
wherein a left region and a right region are defined in the pixel between two adjacent data lines of the data lines based on an imaginary line passing through a center between the two adjacent data lines, the imaginary line extending parallel to the second direction,
wherein the second pixel electrode comprises:
a first stem portion in the right region and extending in a third direction oriented from an origin of a plane, the plane being defined by the first and second directions, the first stem portion extending toward a point in a first quadrant of the plane;
a second stem portion in the left region and adjacent to the first stem portion in the first direction, the second stem portion extending in a fourth direction oriented from the origin of the plane toward a point in a second quadrant of the plane;
a third stem portion in the right region and extending in the fourth direction, the third stem portion being farther from the first pixel electrode than the first stem portion in the second direction;
a fourth stem portion in the left region and extending in the third direction, the fourth stem portion being farther from the first pixel electrode than the second stem portion in the second direction;
first branch portions protruding from the first stem portion in the fourth direction and being spaced apart from each other;
second branch portions protruding from the second stem portion in the third direction and being spaced apart from each other;
third branch portions protruding from the third stem portion in the third direction and being spaced apart from each other; and
fourth branch portions protruding from the fourth stem portion in the fourth direction and being spaced apart from each other.
2. The display apparatus of claim 1, wherein ends of the first to fourth stem portions are connected to each other.
3. The display apparatus of claim 1, wherein:
the first branch portions comprise:
a first sub-branch portion protruding in the fourth direction from a first side of the first stem portion; and
a second sub-branch portion protruding in the fourth direction from a second side of the first stem portion, the second side of the first stem portion being opposite the first side of the first stem portion;
the second branch portions comprise:
a third sub-branch portion protruding in the third direction from a first side of the second stem portion; and
a fourth sub-branch portion protruding in the third direction from a second side of the second stem portion, the second side of the second stem portion being opposite the first side of the second stem portion;
the third branch portions comprise:
a fifth sub-branch portion protruding in the third direction from a first side of the third stem portion; and
a sixth sub-branch portion protruding in the third direction from a second side of the third stem portion, the second side of the third stem portion being opposite the first side of the third stem portion; and
the fourth branch portions comprise:
a seventh sub-branch portion protruding in the fourth direction from a first side of the fourth stem portion; and
an eighth sub-branch portion protruding in the fourth direction from a second side of the fourth stem portion, the second side of the fourth stem portion being opposite the first side of the fourth stem portion.
4. The display apparatus of claim 3, wherein:
each of the first to eighth sub-branch portions comprises lengthening branches, constant branches, and shortening branches arranged in an determined order;
the lengthening branches have lengths increasing in an extension direction of a corresponding stem portion of the first to fourth stem portions from an end of the corresponding stem portion to an opposite end;
the constant branches have a constant length; and
the shortening branches have lengths decreasing in the extension direction from the end of the corresponding stem portion to the opposite end.
5. The display apparatus of claim 1, wherein the first pixel electrode comprises:
a fifth stem portion in the right region and extending in the third direction;
a sixth stem portion in the left region and extending in the fourth direction, the sixth stem portion being adjacent to the fifth stem portion in the first direction;
fifth branch portions protruding from the fifth stem portion in the fourth direction and being spaced apart from each other; and
sixth branch portions protruding from the sixth stem portion in the third direction and being spaced apart from each other.
6. The display apparatus of claim 5, wherein ends of the fifth and sixth stem portions are connected to each other.
7. The display apparatus of claim 5, wherein:
the fifth branch portions comprise:
a ninth sub-branch portion protruding in the fourth direction from a first side of the fifth stem portion; and
a tenth sub-branch portion protruding in the fourth direction from a second side of the fifth stem portion, the second side of the fifth stem portion being opposite the first side of the fifth stem portion; and
the sixth branch portions comprise:
an eleventh sub-branch portion protruding in the third direction from a first side of the sixth stem portion; and
a twelfth sub-branch portion protruding in the third direction from a second side of the sixth stem portion, the second side of the sixth stem portion being opposite the first side of the sixth stem portion.

8. The display apparatus of claim 7, wherein:
each of the ninth to twelfth sub-branch portions comprises lengthening branches, constant branches, and shortening branches arranged in a determined order;
the lengthening branches have lengths increasing in an extension direction of a corresponding stem portion of the fifth and sixth stem portions from an end of the corresponding stem portion to an opposite end;
the constant branches have a constant length; and
the shortening branches have lengths decreasing in the extension direction from the end of the corresponding stem portion to the opposite end.

9. The display apparatus of claim 1, wherein the common electrode comprises:
a first common electrode comprising:
  a first extended portion overlapping with the first stem portion and extending in the third direction; and
  a second extended portion connected to an end of the first extended portion, the second extended portion overlapping with the second stem portion and extending in the fourth direction; and
a second common electrode comprising:
  a third extended portion overlapping with the third stem portion and extending in the fourth direction; and
  a fourth extended portion connected to an end of the third extended portion, the fourth extended portion overlapping with the fourth stem portion and extending in the third direction.

10. The display apparatus of claim 9, wherein:
the first common electrode further comprises:
  a first wing portion overlapping with the first stem portion, the first wing portion extending from an opposite end of the first extended portion that is spaced apart, in the second direction, from the end of the first extended portion;
  a second wing portion overlapping with the second stem portion, the second wing portion extending from an opposite end of the second extended portion that is spaced apart, in the second direction, from an end of the second extended portion connected to the end of the first extended portion; and
  a first vertically extended portion extending in the second direction from the ends of the first and second extended portions that are connected to one another; and
wherein the second common electrode further comprises:
  a third wing portion overlapping with the third stem portion, the third wing portion extending from an opposite end of the third extended portion that is spaced apart, in the second direction, from the end of the third extended portion;
  a fourth wing portion overlapping with the fourth stem portion, the fourth wing portion extending from an opposite end of the fourth extended portion that is spaced apart, in the second direction, from an end of the fourth extended portion connected to the end of the third extended portion; and
  a second vertically extended portion extending in the second direction from the ends of the third and fourth extended portions that are connected to one another.

11. The display apparatus of claim 10, wherein:
each of the first to fourth wing portions is connected to a corresponding one of the first to fourth extended portions at an obtuse angle;
the first vertically extended portion is connected to each of the first and second stem portions at an obtuse angle; and
the second vertically extended portion is connected to each of the third and fourth stem portions at an obtuse angle.

12. The display apparatus of claim 10, wherein:
the first pixel electrode comprises:
  a fifth stem portion in the right region and extending in the third direction;
  a sixth stem portion in the left region and extending in the fourth direction, the sixth stem portion being adjacent to the fifth stem portion in the first direction;
  fifth branch portions protruding from the fifth stem portion in the fourth direction and being spaced apart from each other; and
  sixth branch portions protruding from the sixth stem portion in the third direction and being spaced apart from each other; and
the common electrode further comprises a third common electrode, the third common electrode comprising:
  a fifth extended portion overlapping with the fifth stem portion and extending in the third direction; and
  a sixth extended portion connected to an end of the fifth extended portion, the sixth extended portion overlapping with the sixth stem portion and extending in the fourth direction.

13. The display apparatus of claim 12, wherein the third common electrode further comprises:
a fifth wing portion overlapping with the fifth stem portion, the fifth wing portion extending from an opposite end of the fifth extended portion that is spaced apart, in the second direction, from the end of the fifth extended portion;
a sixth wing portion overlapping with the sixth stem portion, the sixth wing portion extending from an opposite end of the sixth extended portion that is spaced apart, in the second direction, from an end of the sixth extended portion connected to the end of the fifth extended portion; and
a third vertically extended portion extending in the second direction from the ends of the fifth and sixth extended portions that are connected to one another.

14. The display apparatus of claim 13, wherein:
each of the fifth and sixth wing portions is connected to a corresponding one of the fifth and sixth extended portions at an obtuse angle; and
the third vertically extended portion is connected to each of the fifth and sixth stem portions at an obtuse angle.

15. The display apparatus of claim 1, wherein the pixel further comprises:
a first transistor connected to the gate line, the corresponding data line, and the first pixel electrode;
a second transistor connected to the gate line, the corresponding data line, and the second pixel electrode; and
a third transistor connected to the gate line, the second pixel electrode, and a storage line disposed in a same layer as the corresponding data line.

16. The display apparatus of claim 15, wherein the first to third transistors are disposed in a first border region, the first boarded region being disposed between the first and second pixel electrodes in the second direction.

17. The display apparatus of claim 1, wherein the pixel further comprises:
a shielding electrode covering the data lines and disposed in a same layer as the first and second pixel electrodes.

* * * * *